United States Patent
Bain

(10) Patent No.: US 7,225,391 B1
(45) Date of Patent: May 29, 2007

(54) METHOD AND APPARATUS FOR PARALLEL COMPUTATION OF LINEAR BLOCK CODES

(75) Inventor: Peter D. Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 595 days.

(21) Appl. No.: 10/321,030

(22) Filed: Dec. 17, 2002

(51) Int. Cl.
*H03M 13/00* (2006.01)
*G06F 11/00* (2006.01)

(52) U.S. Cl. ............... 714/781; 714/807; 714/752
(58) Field of Classification Search ............ None
See application file for complete search history.

(56) References Cited

U.S. PATENT DOCUMENTS

| | | | |
|---|---|---|---|
| 3,064,080 A * | 11/1962 | Rea et al. ............ 178/23 A |
| 4,928,280 A * | 5/1990 | Nielson et al. ............ 714/762 |
| 5,157,671 A * | 10/1992 | Karplus ............ 714/752 |
| 6,209,112 B1 * | 3/2001 | Stevenson ............ 714/752 |
| 6,694,478 B1 * | 2/2004 | Martinian et al. ............ 714/788 |
| 6,851,086 B2 * | 2/2005 | Szymanski ............ 714/781 |
| 6,920,600 B2 * | 7/2005 | Litwin et al. ............ 714/784 |
| 7,020,826 B2 * | 3/2006 | Litwin et al. ............ 714/784 |
| 2001/0050622 A1 * | 12/2001 | Hewitt et al. ............ 341/50 |

* cited by examiner

*Primary Examiner*—Phung My Chung
(74) *Attorney, Agent, or Firm*—L. Cho

(57) ABSTRACT

A method for generating a linear block code is disclosed. A message is broken up into a plurality of sets of bits. A first group of sets is processed to determine a first partial linear block code. An adjusted partial linear block code is generated from the partial linear block code. A second group of sets is processed to determine a second partial linear block code. The adjusted partial linear block code and the second partial linear block code are combined into a single value.

31 Claims, 15 Drawing Sheets snplus1 [0] := b[0] ^sn[31]
snplus1 [1] := b[0] ^sn[0] ^sn[31]
snplus1 [2] := b[0] ^sn[1] ^sn[31]
snplus1 [3] := sn[2]
snplus1 [4] := b[0] ^sn[3] ^sn[31]
snplus1 [5] := b[0] ^sn[4] ^sn[31]
snplus1 [6] := sn[5]
snplus1 [7] := b[0] ^sn[6] ^sn[31]
snplus1 [8] := b[0] ^sn[7] ^sn[31]
snplus1 [9] := sn[8]
snplus1 [10] := b[0] ^sn[9] ^sn[31]
snplus1 [11] := b[0] ^sn[10] ^sn[31]
snplus1 [12] := b[0] ^sn[11] ^sn[31]
snplus1 [13] := sn[12]
snplus1 [14] := sn[13]
snplus1 [15] := sn[14]
snplus1 [16] := b[0] ^sn[15] ^sn[31]
snplus1 [17] := sn[16]
snplus1 [18] := sn[17]
snplus1 [19] := sn[18]
snplus1 [20] := sn[19]
snplus1 [21] := sn[20]
snplus1 [22] := b[0] ^sn[21] ^sn[31]
snplus1 [23] := b[0] ^sn[22] ^sn[31]
snplus1 [24] := sn[23]
snplus1 [25] := sn[24]
snplus1 [26] := b[0] ^sn[25] ^sn[31]
snplus1 [27] := sn[26]
snplus1 [28] := sn[27]
snplus1 [29] := sn[28]
snplus1 [30] := sn[29]
snplus1 [31] := sn[30]

FIG. 3

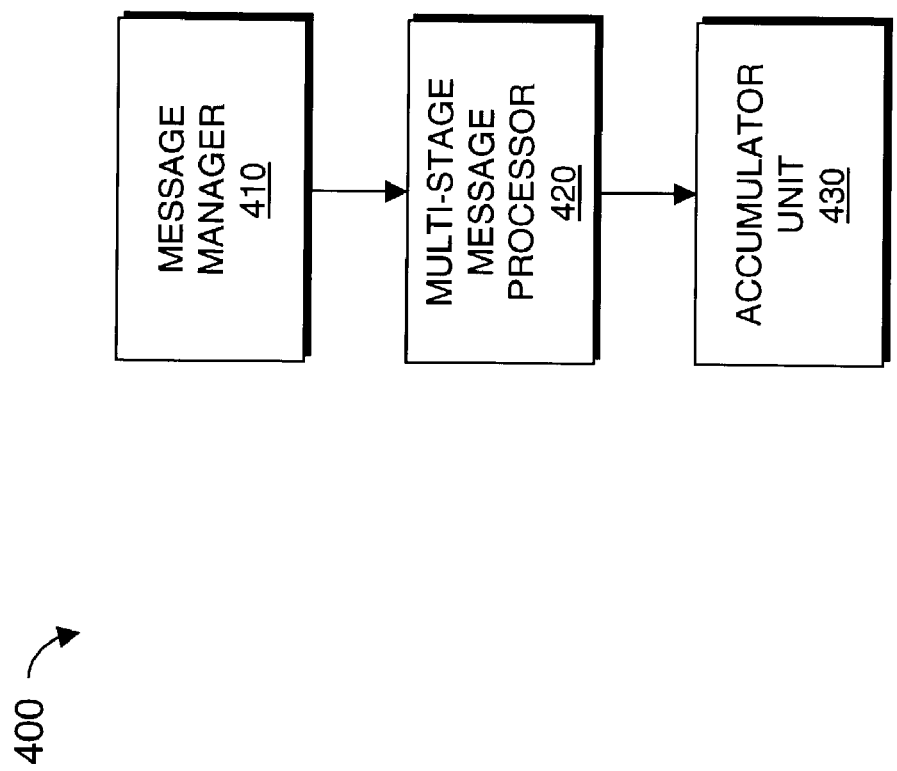

| Cycle Number | Input bits | Input From | Input To | Msg proc 0 From | Msg proc 0 To | Msg proc 1 From | Msg proc 1 To | Msg proc 2 From | Msg proc 2 To | Msg proc 3 From | Msg proc 3 To | Combination To |
|---|---|---|---|---|---|---|---|---|---|---|---|---|
| 0 | 32 | 0 | 31 | 0 | 7 | | | | | | | |
| 1 | 32 | 32 | 63 | 32 | 39 | 0 | 15 | | | | | |
| 2 | 32 | 64 | 95 | 64 | 71 | 32 | 47 | 0 | 23 | | | |
| 3 | 32 | 96 | 127 | 96 | 103 | 64 | 79 | 32 | 55 | 0 | 31 | |
| 4 | 32 | 128 | 159 | 128 | 135 | 96 | 111 | 64 | 87 | 32 | 63 | 31 |
| 5 | 32 | 160 | 191 | 160 | 167 | 128 | 143 | 96 | 119 | 64 | 95 | 63 |
| 6 | 32 | 192 | 223 | 192 | 199 | 160 | 175 | 128 | 151 | 96 | 127 | 95 |
| 7 | 32 | 224 | 255 | 224 | 231 | 192 | 207 | 160 | 183 | 128 | 159 | 127 |
| 8 | 32 | 256 | 287 | 256 | 263 | 224 | 239 | 192 | 215 | 160 | 191 | 159 |
| 9 | 32 | 288 | 319 | 288 | 295 | 256 | 271 | 224 | 247 | 192 | 223 | 191 |
| 10 | 32 | 320 | 351 | 320 | 327 | 288 | 303 | 256 | 279 | 224 | 255 | 223 |
| 11 | 32 | 352 | 383 | 352 | 359 | 320 | 335 | 288 | 311 | 256 | 287 | 255 |
| 12 | 32 | 384 | 415 | 384 | 391 | 352 | 367 | 320 | 343 | 288 | 319 | 287 |
| 13 | 32 | 416 | 447 | 416 | 423 | 384 | 399 | 352 | 375 | 320 | 351 | 319 |
| 14 | 32 | 448 | 479 | 448 | 455 | 416 | 431 | 384 | 407 | 352 | 383 | 351 |
| 15 | 32 | 480 | 511 | 480 | 487 | 448 | 463 | 416 | 439 | 384 | 415 | 383 |
| 16 | 32 | 512 | 543 | 512 | 519 | 480 | 495 | 448 | 471 | 416 | 447 | 415 |
| 17 | 32 | 544 | 575 | 544 | 551 | 512 | 527 | 480 | 503 | 448 | 479 | 447 |
| 18 | 32 | 576 | 607 | 576 | 583 | 544 | 559 | 512 | 535 | 480 | 511 | 479 |
| 19 | | | | | | 576 | 591 | 544 | 567 | 512 | 543 | 511 |
| 20 | | | | | | | | 576 | 599 | 544 | 575 | 543 |
| 21 | | | | | | | | | | 576 | 607 | 575 |

FIG. 10

| Cycle Number | Input bits | Input From | Input To | Msg proc 0 From | Msg proc 0 To | Msg proc 1 From | Msg proc 1 To | Msg proc 2 From | Msg proc 2 To | Msg proc 3 From | Msg proc 3 To | Combination To |
|---|---|---|---|---|---|---|---|---|---|---|---|---|
| 0 | 32 | 0 | 31 | | | | | | | | | |
| 1 | 32 | 32 | 63 | 0 | 7 | | | | | | | |
| 2 | 32 | 64 | 95 | 32 | 39 | 0 | 15 | | | | | |
| 3 | 32 | 96 | 127 | 64 | 71 | 32 | 47 | | | | | |
| 4 | 32 | 128 | 159 | 96 | 103 | 64 | 79 | 0 | 23 | | | |
| 5 | 24 | 160 | 183 | 128 | 135 | 96 | 111 | 32 | 55 | | | |
| 6 | 32 | 184 | 215 | 160 | 167 | 128 | 143 | 64 | 87 | | | |
| 7 | 16 | 216 | 231 | 184 | 191 | 160 | 175 | 96 | 119 | 0 | 31 | 31 |
| 8 | 32 | 232 | 263 | 216 | 223 | 184 | 199 | 128 | 151 | 32 | 63 | 63 |
| 9 | 8 | 264 | 271 | 232 | 239 | 216 | 231 | 160 | 183 | 64 | 95 | 95 |
| 10 | 32 | 272 | 303 | 264 | 271 | 232 | 247 | 184 | 207 | 96 | 127 | 127 |
| 11 | 32 | 304 | 335 | 272 | 279 | 264 | 271 | 216 | 231 | 128 | 159 | 159 |
| 12 | 0 | 336 | 335 | 304 | 311 | 272 | 287 | 232 | 255 | 160 | 183 | 183 |
| 13 | 32 | 336 | 367 | 336 | 335 | 304 | 319 | 264 | 271 | 184 | 215 | 215 |
| 14 | 32 | 368 | 399 | 336 | 343 | 336 | 335 | 272 | 295 | 216 | 231 | 231 |
| 15 | 32 | 400 | 431 | 368 | 375 | 336 | 351 | 304 | 327 | 232 | 263 | 263 |
| 16 | 32 | 432 | 463 | 400 | 407 | 368 | 383 | 336 | 335 | 264 | 271 | 271 |
| 17 | 32 | 464 | 495 | 432 | 439 | 400 | 415 | 336 | 359 | 272 | 303 | 303 |
| 18 | 32 | 496 | 527 | 464 | 471 | 432 | 447 | 368 | 391 | 304 | 335 | 335 |
| 19 | 32 | 528 | 559 | 496 | 503 | 464 | 479 | 400 | 423 | 336 | 335 | 335 |
| 20 | 32 | 560 | 591 | 528 | 535 | 496 | 511 | 432 | 455 | 336 | 367 | 367 |
|  |  |  |  | 560 | 567 | 528 | 543 | 464 | 487 | 368 | 399 | 399 |
|  |  |  |  |  |  |  |  | 496 | 519 | 400 | 431 | 431 |
|  |  |  |  |  |  |  |  |  |  | 432 | 463 | 463 |
|  |  |  |  |  |  |  |  |  |  | 464 | 495 |  |

| Cycle number | Input bits | Input From | Input To | Msg proc 0 From | Msg proc 0 To | Msg proc 1 From | Msg proc 1 To | Msg proc 2 From | Msg proc 2 To | Msg proc 3 From | Msg proc 3 To | Combination To | Shunt From | Shunt To | Shunt From | Shunt To | Shunt From | Shunt To |
|---|---|---|---|---|---|---|---|---|---|---|---|---|---|---|---|---|---|---|
| 0 | 32 | 0 | 31 | | | | | | | | | | | | | | | |
| 1 | 32 | 32 | 63 | 0 | 7 | | | | | | | | | | | | | |
| 2 | 32 | 64 | 95 | 32 | 39 | | | | | | | | | | | | | |
| 3 | 32 | 96 | 127 | 64 | 71 | | | | | | | | | | | | | |
| 4 | 32 | 128 | 159 | 96 | 103 | 0 | 15 | | | | | | | | | | | |
| 5 | 32 | 160 | 191 | 128 | 135 | 32 | 47 | | | | | | | | | | | |
| 6 | 32 | 192 | 223 | 160 | 167 | 64 | 79 | 0 | 23 | | | | | | | | | |
| 7 * | 16 | 224 | 239 | 192 | 199 | 96 | 111 | 32 | 55 | | | | | | | | | |
| 8 | 32 | 0 | 15 | 224 | 231 | 128 | 143 | 64 | 87 | 0 | 31 | | | | | | | |
| 9 | 32 | 16 | 47 | 16 | 23 | 160 | 175 | 96 | 119 | 32 | 63 | 31 | | | | | | |
| 10 | 32 | 48 | 79 | 48 | 55 | 192 | 207 | 128 | 151 | 64 | 95 | 63 | | | | | | |
| 11 | 32 | 80 | 111 | 80 | 87 | 224 | 239 | 160 | 183 | 96 | 127 | 95 | 224 | 239 | | | | |
| 12 | 32 | 112 | 143 | 112 | 119 | 16 | 31 | 192 | 215 | 128 | 159 | 127 | | | 224 | 239 | | |
| 13 | 32 | 144 | 175 | 144 | 151 | 48 | 63 | 0 | 7 | 160 | 191 | 159 | | | | | 224 | 239 |
| 14 | | | | | | 80 | 95 | 16 | 39 | 192 | 223 | 191 | | | | | 0 | 0 |
| 15 | | | | | | 112 | 127 | 48 | 71 | 0 | 15 | 223 | | | | | 0 | 0 |
| 16 | | | | | | 144 | 159 | 80 | 103 | 16 | 47 | 15 | | | | | 0 | 0 |

* Input 224–239 from msg 1
0–15 from msg 2 during cycle 7

METHOD AND APPARATUS FOR PARALLEL COMPUTATION OF LINEAR BLOCK CODES

FIELD OF THE INVENTION

The present invention relates to the computation of linear block codes. More specifically, the present invention relates to a method and apparatus for the parallel computation of linear block codes.

BACKGROUND

Data communications and storage systems typically detect transmission or storage errors in blocks of data ("messages") by checksums over the message bits. A common class of checksums is the linear block code. Linear block codes include, for example, Cyclic Redundancy Check (CRC), Reed-Solomon codes, and Bose, Chaudhuri, and Hocquengham (BCH) codes.

As data communications and storage systems transmit and receive transmitted messages at a faster rate, computation of checksums need to match this rate. In order to accelerate the processing of linear block codes, some techniques attempted to process messages bits in parallel. Many of these techniques still suffered the drawback of requiring a large amount of time because of the large number of message bits they handle and the size of the resulting expressions.

A 32-bit parallel computation of a CRC-32, for example, requires approximately 900 exclusive-OR gates. Some of the expressions handled by past techniques also include up to 33 terms. Logic limitations such as gate fan-in and the number of inputs in a field programmable gate array (FPGA) lookup table, required multi-level implementation and a large amount of interconnection wiring. This resulted in limiting the speed of the circuit. In addition, many of these techniques also require large amounts of hardware to handle fluctuations in the rate in which message bits arrived. This translated to additional costs and additional space requirement for the hardware on the system, which was undesirable.

Thus, what is needed is an efficient and cost effective technique for computing linear block codes.

SUMMARY

A method and apparatus for parallel computation of a linear block code for a message is disclosed. According to an embodiment of the present invention, bits of the message are organized into manageable groups that generate expressions that may be efficiently processed. Groups of message bits from a single message or a plurality of messages may be processed in parallel in a pipeline fashion in order to accelerate the computation of linear block codes. As the groups of a message are processed, the generated results are adjusted to allow them to be combined with subsequently generated results. The combination of the separately generated results is equivalent to that of a linear block code for the message that has been processed serially.

A linear block code processor is disclosed according to an embodiment of the present invention. The linear block code processor includes a multi-stage message processor. The multi-stage processor generates a first partial linear block code from a first group of consecutive bits from a message and generates a second partial linear block code from a second group of consecutive bits from the message in a pipelined fashion. The linear block code unit also includes an accumulator unit. The accumulator unit generates a linear block code from the first partial linear block code and the second partial linear block code.

A method for generating a linear block code is disclosed according to an embodiment of the present invention. A message is broken up into a plurality of sets of bits. A first group of sets is processed to determine a first partial linear block code. An adjusted partial linear block code is generated from the partial linear block code. A second group of sets is processed to determine a second partial linear block code. The adjusted partial linear block code and the second partial linear block code are combined into a single value.

A method for computing a linear block code for a message is disclosed according to an embodiment of the present invention. Bits of the message are organized into sets corresponding to stages of the message. A parity result is determined for each of the sets from bits of the message in a set and either an initial value or a parity result of a set from a previous stage of the message. The linear block code is determined from the parity results.

A method for computing linear block codes for a first and second message is disclosed according to an embodiment of the present invention. Bits of the first message are organized into first sets corresponding to stages of the first message. Bits of the second message are organized into second sets corresponding to stages of the second message. Parity results are determined for each of the first and second sets based upon bits in a set and either an initial value or a parity result of a set from a previous stage of a corresponding message. The determination of the parity results for each of the first and second sets is pipelined. Linear block codes of the first and second messages are determined from the parity results.

BRIEF DESCRIPTION OF THE DRAWINGS

The features and advantages of the present invention are illustrated by way of example and are by no means intended to limit the scope of the present invention to the particular embodiments shown, and in which:

FIG. 3 lists equations for serial calculation of CRC-32 where the relationship between a checksum for n+1 message bits and the checksum of n message bits is illustrated;

FIG. 4 is a block diagram of a linear block code processor according to an embodiment of the present invention;

Figure 6A:
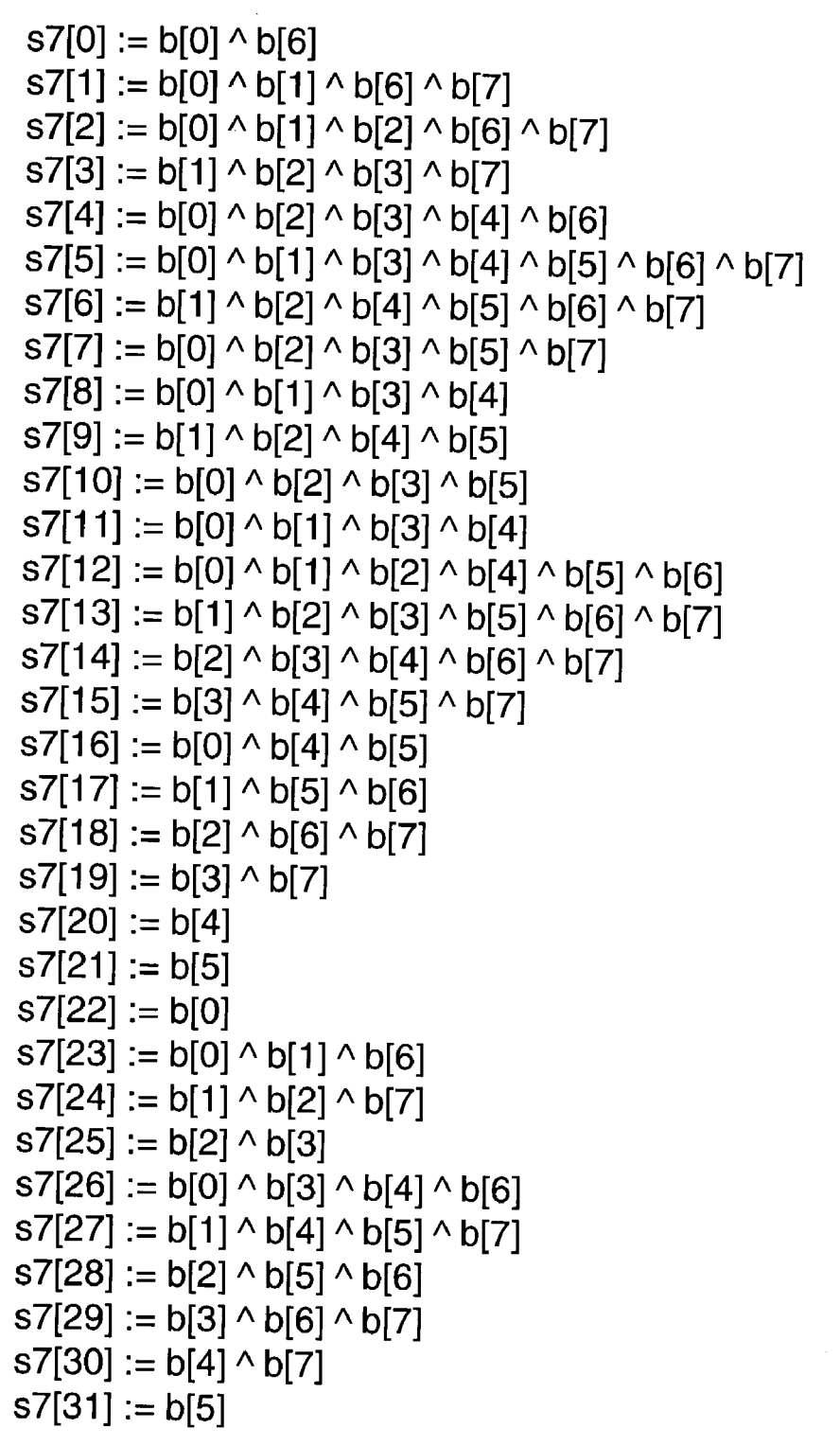
Figure 6B:
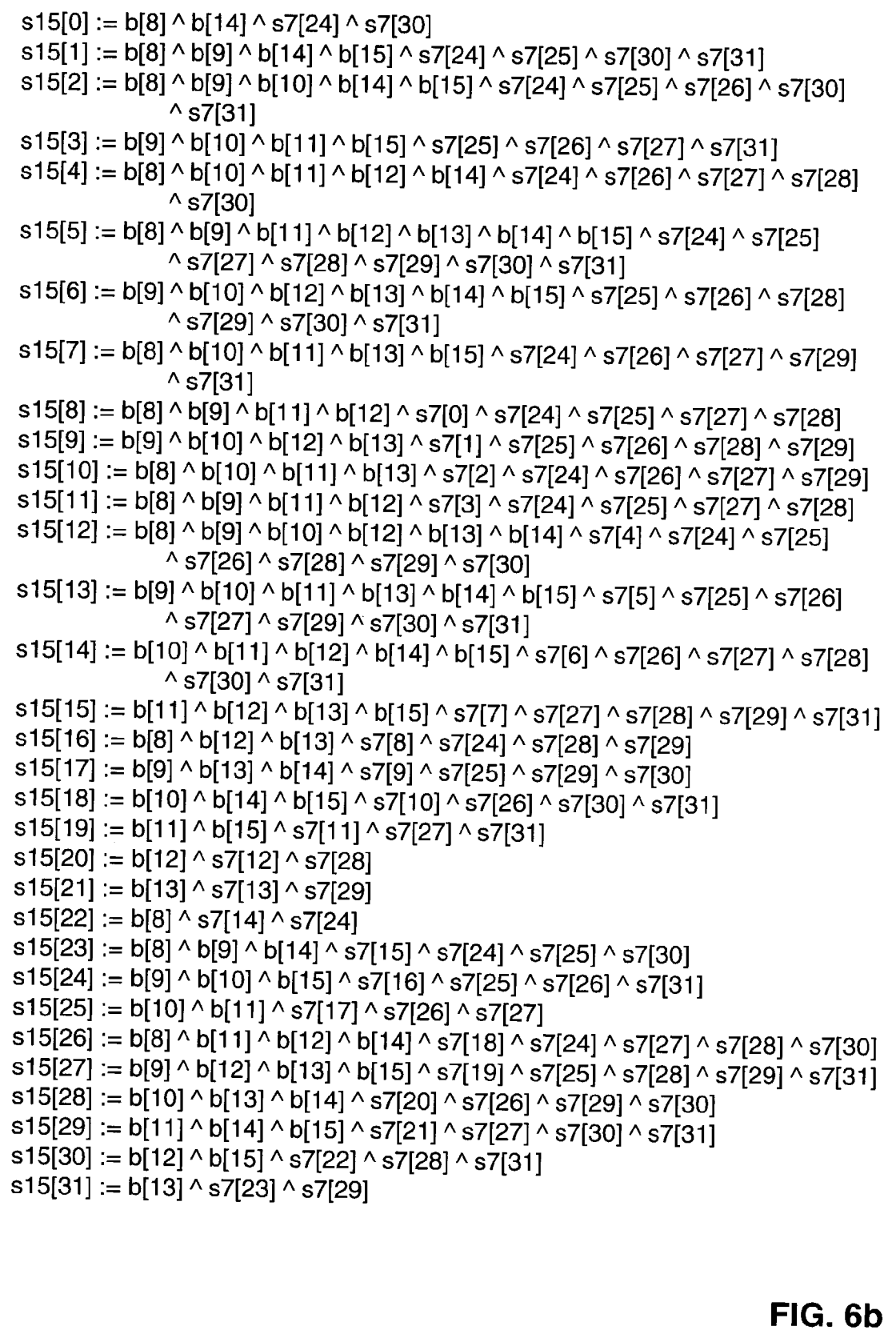
Figure 6C:
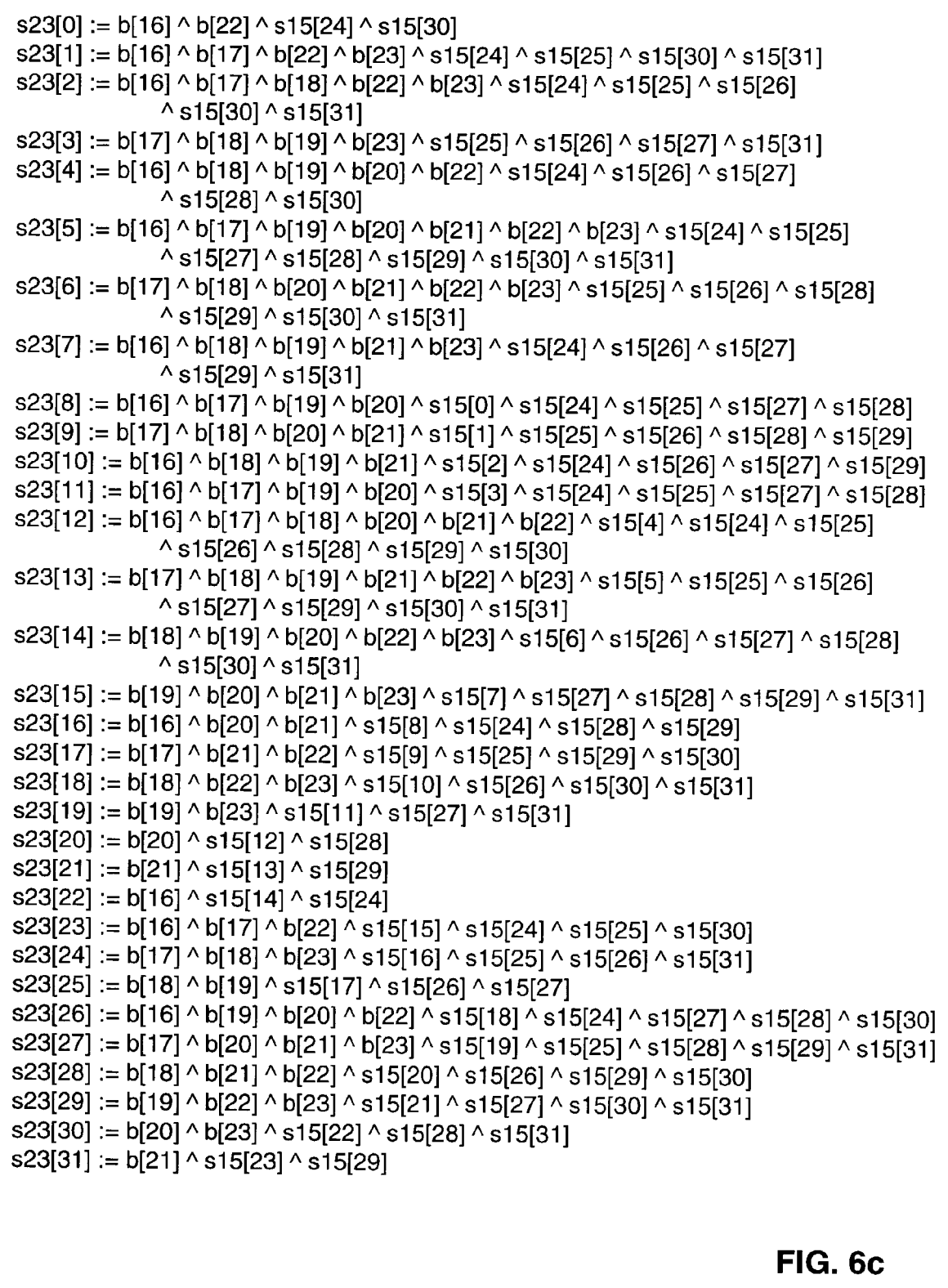

FIG. 6a illustrates exemplary computation performed by a first stage of the multi-stage message processor according to an embodiment of the present invention;

FIG. 6b illustrates exemplary computation performed by a second stage of the multi-stage message processor according to an embodiment of the present invention;

FIG. 6c illustrates exemplary computation performed by a third stage of the multi-stage message processor according to an embodiment of the present invention;

FIG. 6d illustrates exemplary computation performed by a fourth stage of the multi-stage message processor according to an embodiment of the present invention;

FIG. 10 is a table illustrating processing of linear block codes where the input bits are associated with full groups;

FIG. 11 is a table illustrating processing of linear block codes where the input bits are associated with full and partial groups; and FIG. 12 is a table illustrating processing of linear block codes where the input bits are associates with a plurality of groups.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

Figure 1:
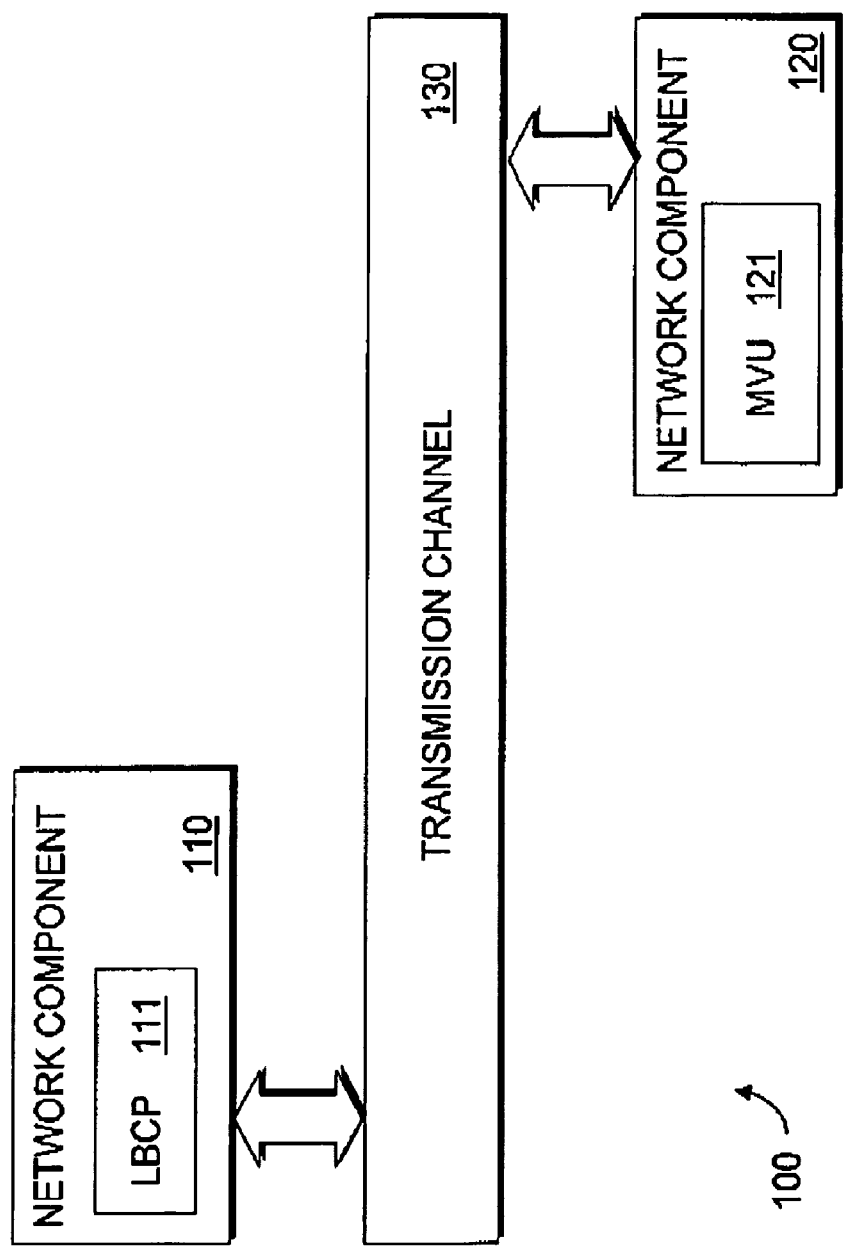
FIG. 1 is a block diagram of a data communication system according to an embodiment of the present invention.

FIG. 1 is a block diagram illustrating a communication network 100 according to an embodiment of the present invention. The communication network 100 includes a first network component 110 and a second network component 120. According to an embodiment of the communication network 100, the first network component 110 may operate as a data transmitter 110 and the second network component 120 may operate as a data receiver 120. The first network component 110 transmits data, such as messages, to the second network component 120 over transmission channel 130, The first network component 110 includes a linear block code processor (LBCP) 111. The linear block code processor 111 generates a linear block code or checksum from bits of a message using a linear block code, such as CRC, Reed-Solomon codes, BCH codes, or other codes.

The linear block code is transmitted with a message or a portion of a message to the second network component 120 us a code word. A message verification unit (MVU) 121 in the second network component 120 determines whether any transmission errors are in the received message by comparing the linear block code received from the first network component 110 and a linear block code calculated from the received message. In addition to being used in data transmission applications, it should be appreciated that linear block codes may be used in data storage applications where data is stored on persistent storage mediums such as CDs, tapes, or diskettes.

Many of the linear block codes are based on polynomial division in a Galois field. Code word bits are considered to be a coefficient of a polynomial, which are dividable by a generator polynomial. The remainder at the end of the division is the basis of the linear block code, which is appended to the message bits to form a code word. The code word has the property that when it is divided by the generator polynomial, the remainder ("syndrome") is a constant for a given generator polynomial. Code words that include invalid data would generate a code word that would not generate a valid syndrome.

Figure 2:
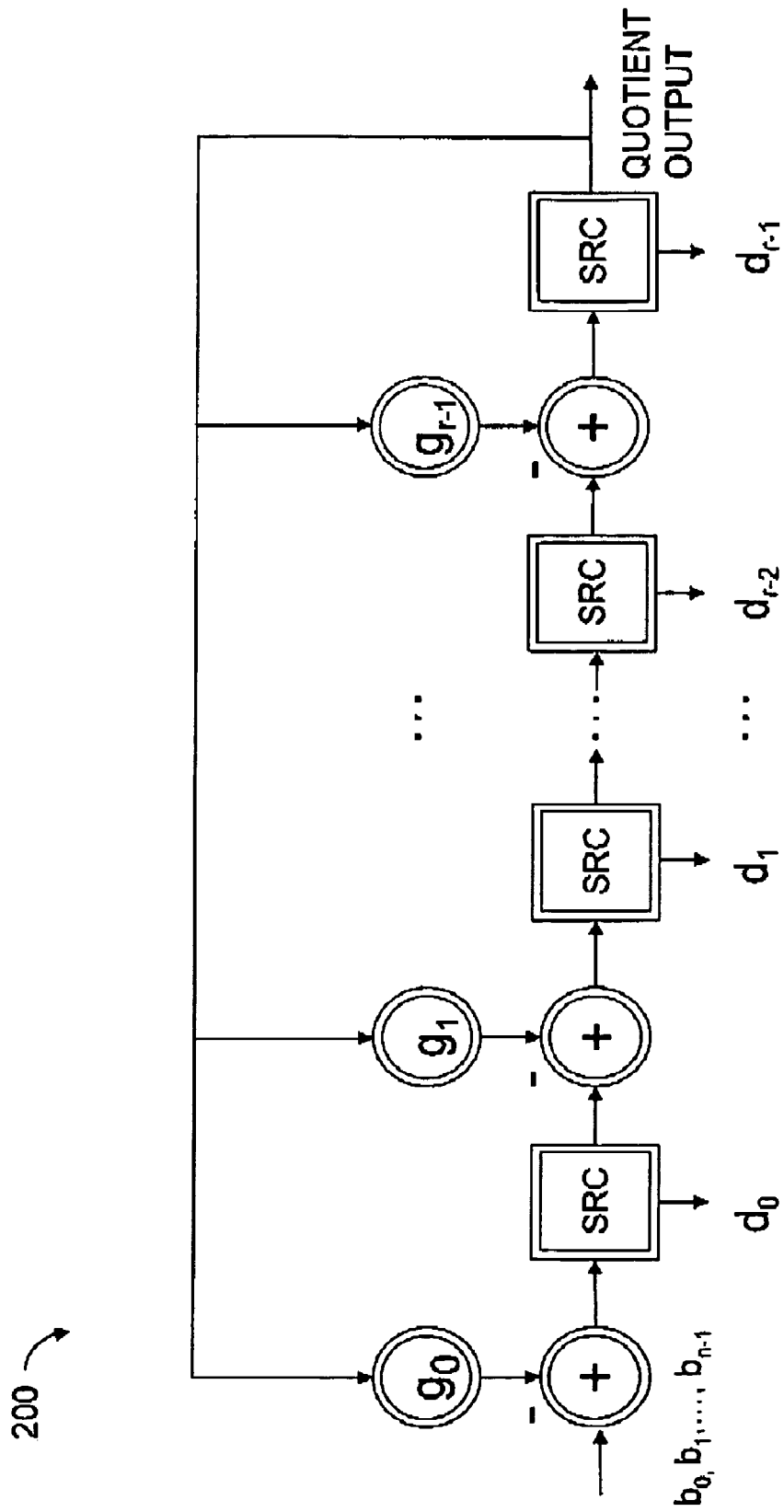
FIG. 2 is a block diagram of a linear feedback shift register used for performing polynomial division.

One technique that may be used to generate a linear block code involves performing division one bit at a time, using a linear feedback shift register (LFSR). FIG. 2 illustrates an embodiment of a LFSR 200 that may be used. The LFSR 200 divides a message $b(x)=b_0+b_1x+ \ldots +b_{n-1}x^{n-1}$ by a generator polynomial $g(x)=g_0+g_1x+ \ldots +g_{r-1}x^{r-1}+x^r$ and retains the remainder $d(x)=d_0+d_1x+ \ldots +d_{r-1}x^{r-1}$. The number of stages in the LFSR is the order (number of bits) in the generator polynomial g(x). The symbols $b_0, b_1, \ldots, b_{n-2}, b_{n-1}$ are fed into the shift register one at a time in order of decreasing index. When the last symbol ($b_0$) has been fed into the rightmost shift register cell (SRC), the shift register cell will contain the coefficients of the remainder polynomial. The shift register divider in FIG. 2 operates in the same manner in which one performs long division.

Given the following definitions:

Bn=message bit n,

Sn=Checksum over message bits [0 . . . n],

D1=Checksum generating function (polynomial division), where a next checksum is generated from a current checksum over an additional bit of a message, C(x)=Division of polynomial x by generator G, the following relationships exist.

$Sn+1=D1(Sn,Bn+1)$, or $$Sn+1=C(\{Bn+1 \ldots B0\}) \quad (1)$$

Thus, once the bits of a checksum for a given n bits of a message has been calculated, the bits of a checksum for a given n+1 bits of the message may be derived. An example of this is shown in FIG. 3. FIG. 3 lists equations that illustrate the relationship between a checksum for n+1 bits of a message given a checksum for a previous n bits of the message. The term "^" shown in FIG. 3 and FIGS. 6(a)–(d) denotes the XOR function. This example uses a generator polynomial for CRC-32 polynomial, where $G=x^{32}+x^{26}+x^{23}+x^{22}+x^{16}+x^{12}+x^{11}+x^{10}+x^8+x^7+x^6+x^5+x^4+x^2+x^1+x^0$.

FIG. 4 is a block diagram illustrating a linear block code processor 400 according to an embodiment of the present invention. The linear block code processor 400 may be used, for example, to implement the linear block code processor 111 described in FIG. 1. The linear block code processor 400 includes a message manager 410, multi-stage message processor 420, and an accumulator unit 430. The multi-stage message processor 420 and the accumulator unit 430 operate to generate a linear block code from bits of a message.

According to an embodiment of the linear block code processor 400, multiple message bits are processed in parallel. A message may be divided into sets that include any fixed number of bits. Each set of a fixed number of bits of a message corresponds to a stage of the message. The sets are processed sequentially from highest to lowest order to generate parity results where the first bits processed correspond to the highest order coefficient terms of the polynomial. The parity result for a set is generated from message bits associated with the set and either the parity result corresponding to an earlier stage of the message or an initial value. A plurality of sets from a single or a plurality of messages may also be processed in parallel by the multi-stage message processor 420.

To process the message bits in parallel, the relationships shown in equation (1) may be applied recursively to determine additional relationships between a checksum of a determined number of message bits and a previously determined checksum. Applying equation (1) recursively, the relationship between a checksum for n+2 bits of a message and a checksum for n bits of a message may be illustrated as follows.

$$S_{n+2} = D1(S_{n+1}, B_{n+2})$$

$$S_{n+2} = D1(D1(S_n, B_{n+1}), B_{n+2})$$

$$S_{n+2} = D2(S_n, \{B_{n+1}, B_{n+2}\})$$

It should be appreciated that D2 is a checksum generating function (polynomial division), where a next checksum is generated from a current checksum over an additional two bits of a message.

Similarly, additional relationships may be determined to architect the multi-stage message processor 420 such that it processes bits from a message a set at a time. For example, the relationship between a checksum for n+8 bits of a message and a checksum for n bits of a message, a checksum for n+16 bits of a message and a checksum for n+8 bits of a message, a checksum for n+24 bits of a message and a checksum for n+16 bits of a message, and a checksum for n+32 bits of a message and a checksum for n+24 bits of a message may be determined. These relationships are illustrated in equations (2a)–(2d) respectively.

$$S_{n+7} = D8(S_n, \{B_{n+0} \ldots B_{n+7}\}) \quad (2a)$$

$$S_{n+15} = D8(S_{n+8}, \{B_{n+8} \ldots B_{n+15}\}) \quad (2b)$$

$$S_{n+23} = D8(S_{n+16}, \{B_{n+16} \ldots B_{n+23}\}) \quad (2c)$$

$$S_{n+31} = D8(S_{n+24}, \{B_{n+24} \ldots B_{n+31}\}) \quad (2d)$$

In the case where n=0, equations (2a)–(2d) may be represented as follows.

$$S7 = D8(0, \{B1 \ldots B7\}) \quad (3a)$$

$$S15 = D8(S8, \{B8 \ldots B15\}) \quad (3b)$$

$$S23 = D8(S16, \{B16 \ldots B23\}) \quad (3c)$$

$$S31 = D8(S24, \{B24 \ldots B31\}) \quad (3d)$$

Equations (3a)–(3d), for example, may be used to represent the calculations performed by the multi-stage message processor 420 to compute a 32 bit checksum. In this example, the message bits are organized into sets of 8 bits. The first 8 bits of the message are processed according to equation (3a). The second 8 bits of the message are processed according to equation (3b). The third 8 bits of the message are processed according to equation (3c). The fourth 8 bits of the message are processed according to equation (3d). Specific components in the multi-stage message processor 420 may be designated to perform each of the equations (3a)–(3d). Equations (3a)–(3d) may be performed sequentially in a pipelined fashion by the multi-stage message processor 420 in order to generate parity results for sets corresponding to a plurality of message in parallel. Sets of message bits sequentially processed by components designated to perform equations (3a)–(3d) are said to be in a "group". The multi-stage message processor 420 may begin processing additional groups of sets before finishing processing a first group of sets. It should be appreciated that the multi-stage message processor 420 may process a codeword or message of any length, that the multi-stage message processor 420 may process any number of sets of message bits in parallel, and that the sets of message bits may be defined as being any number.

Depending on the number of bits in the message and the number of message bits processed in a group, the parity results generated may either be used as the checksum for the message or may be adjusted and combined with other parity results by the accumulator unit 430 in order to generate the checksum. If all the bits of a message are processed after a single group of sets are processed by the multi-stage message processor 420, then the parity result corresponding to the last stage of the message is the linear block code for the message. However, if an additional group needs to be processed by the multi-stage message processor 420 to process additional message bits, then the parity result associated with the last set in the first group may be further processed and combined with other results generated by the multi-stage message processor 420 in order to generate the linear block code for the message.

According to an embodiment of the message processor 400, the parity result associated with the last set of a group is designated as a partial linear block code or a partial checksum. This value is forwarded to the accumulator unit 430. When all the bits of a message are processed after a single group of sets are processed by the multi-stage message processor 420, the partial linear block code is designated as the linear block code for the message. According to an alternate embodiment of the message processor 400, when all the bits of a message are processed after a single group of sets are processed by the multi-stage message processor 420, the parity result associated with the last set of message bits is designated as the linear block code of the message. In this embodiment, the parity result need not be forwarded to the accumulator unit 430.

When not all of the bits of a message are processed in a single group by the multi-stage message processor 420, adjustments are made to the partial linear block code. The accumulator unit 430 adjust the partial linear block code by shifting it g bits to the left, where g is the number of message bits that were processed by the multi-level message processor 420 to generate the partial linear block code. The accumulator unit 430 then divides this value by the generator polynomial. This adjusted partial linear block code is then combined with a next partial linear block code of the multi-level message processor 420. The accumulator unit 430 may continue to adjust the combined values until a last partial linear block code associated with a message is received from the multi-level message processor 420. The combination of the last partial linear block code associated with a message with the most recent adjusted partial linear block code is designated as the checksum for the message.

The accumulator unit 430 allows the linear block code processor 400 to break down long messages into manageable lengths that may be calculated in an efficient manner. The properties of linear block codes allow partial linear block codes to be computed and added together as shown below.

S31 is the linear block code or checksum over the group of message bits Bn+31 ... Bn in isolation. Similarly, S63 is the checksum over the group of message bits Bn+63 ... Bn in isolation.

$$S31 = C(\{B0 \ldots B31\})$$

$$S63 = C(\{B0 \ldots B63\})$$

$$S63 = C(\{\{B0 \ldots B31\}, 32\{0\}\}) + C(\{B32 \ldots B63\})$$

$$S63 = D32(S31, 32\{0\}) + S63 \quad (4)$$

For equation (4), 32{0} represents 32 zero bits, and + represents modulo-2 addition (exclusive OR). D32(S31, 32{0}) is a tractable calculation, since all data (B) terms are constant and equal to zero. By letting Zg(Sn)=Dg (Sg, g{0}), where g is the number of bits that may be processed by the multi-stage message processor 420 at a time, the accumulation procedures performed by the accumulation unit 430 becomes Sn+g=Sg+Zg (Sn), where Sn is calculated by equations (3a)–(3d). Note that S0 is usually initialized to all ones for CRC calculations.

The message manager 410 routes bits of a message to the multi-stage message processor 420. According to an embodiment of the linear block code processor 400, the message manager 410 routes all the bits of the message to the multi-stage message processor 420. Alternatively, the message manager 410 may route g bits of data to the multi-stage message processor 420 if the data path to the multi-stage processor 420 is limited. In still another embodiment of the linear block code processor 400, the message manager 410 may route specific sets of bits to components in the multi-stage message processor 420 designated for processing the specific sets of bits.

Figure 5:
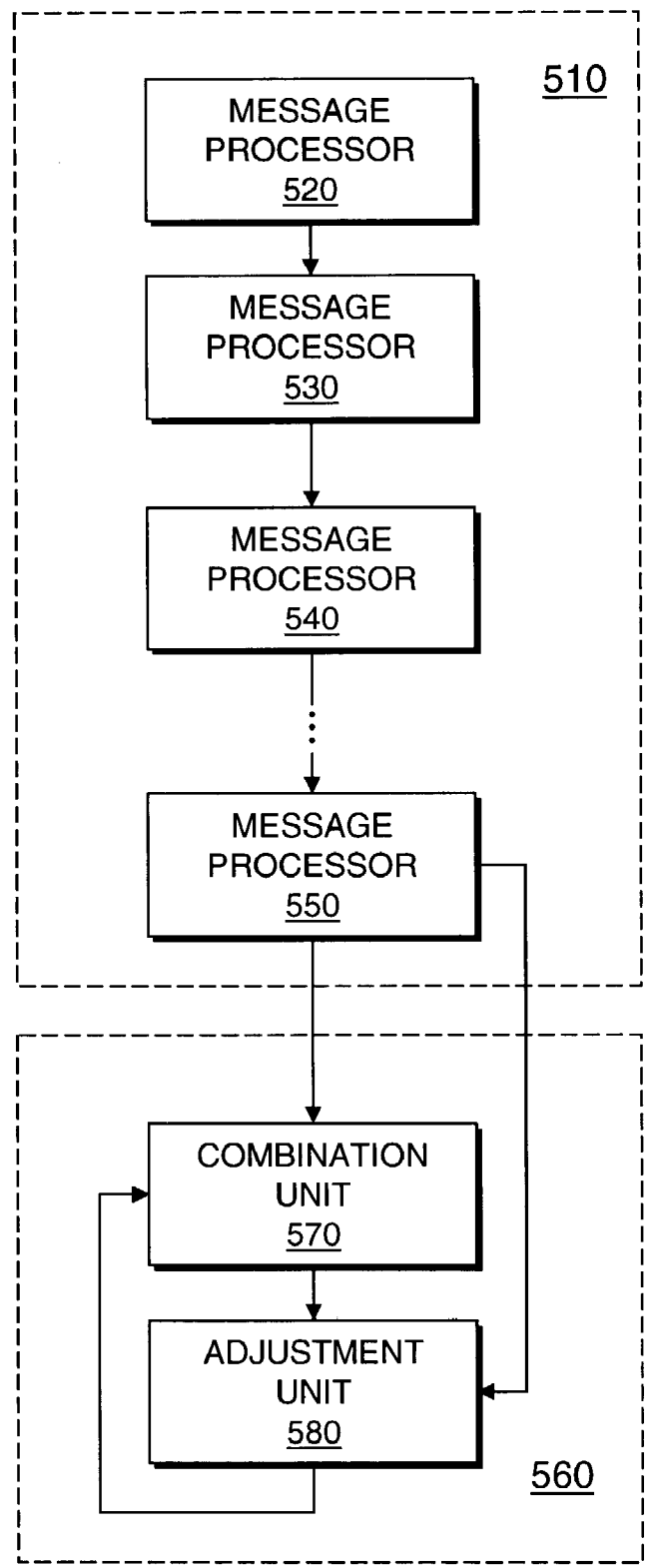
FIG. 5 is a block diagram of the multi-stage message processor and accumulator unit shown in FIG. 2 according to an embodiment of the present invention.

FIG. 5 is a block diagram illustrating a multi-stage message processor 510 and an accumulator unit 560 according to an embodiment of the present invention. The multi-stage message processor 510 and the accumulator unit 560 may be used to implement the multi-stage message processor 420 and the accumulator unit 430 shown in FIG. 4. The multi-stage message processor 510 includes a first message processor 520, a second message processor 530, a third message processor 540, and an nth message processor 550, where the first message processor 520 is the lowest order message processor and nth message processor 550 is the highest order message processor, and where n can be any number. Each of the message processors may be designated to process a set of message bits in a message. After a message processor has calculated a parity result for its set of message bits, the message processor forwards the calculated parity result to the next higher order message processor. In this way, the sets of message bits associated with a message are processed sequentially in stages.

If all the bits of a message are processed after a single iteration by the multi-stage message processor 510, then the parity result corresponding to the last stage of the message is the linear block code or checksum for the message. However, if an additional iteration needs to be performed (additional group needs to be processed) by the multi-stage message processor 510 to process additional message bits, then the parity result associated with the last set of message bits processed during an iteration is further processed by the accumulator unit 560. The last set of message bits processed during an iteration is processed by an "end stage", last stage, or nth message processor 550 of the multi-stage message processor 510. The parity result associated with the last set of message bits processed is referred to as a partial linear block code or partial checksum.

The accumulator unit 560 includes a combination unit 570, and an adjustment unit 580. The adjustment unit 580 adjusts the partial linear block code received from the multi-stage message processor 510 by shifting the partial linear block code g bits to the left, where g is the number of message bits that was processed by the multi-level message processor 510 to generate the partial linear block code. According to an embodiment of the accumulator unit 560, the adjustment unit 580 includes a shifting unit (not shown) that performs the shifting operation. The parity result adjuster 580 then divides this value by the generator polynomial. According to an embodiment of the accumulator unit 560, the adjustment unit 580 includes a divider unit (not shown) that performs the division operation. This may be illustrated by the following expression. Sn+g=Sg+Zg (Sn), where Zg(Sn)=Dg (Sg, g{0}). The partial linear block code may be transmitted directly from the multi-stage message processor 510 to the adjustment unit 580. Alternatively, the partial linear block code may be transmitted to the adjustment unit 580 via the combination unit 570.

The adjusted partial linear block code is forwarded to the combination unit 570 where it may be combined with a next partial linear block code from the multi-level message processor 510. The accumulator unit 560 may continue to adjust the combined values until a last partial linear block code associated with a message is received from the multi-level message processor 510. The combination of the last partial linear block code associated with a message with the most recent adjusted partial linear block code is designated as the linear block code for the message.

According to an embodiment of the present invention, the multi-stage message processor 510 includes four message processors. In this embodiment, the first message processor 520 may generate a first parity result from a first set of message bits using equation (3a). The second message processor 530 may generate a second parity result from a second set of message bits using equation (3b). The third message processor 540 may generate a third parity result from a third set of message bits using equation (3c). The fourth message processor 550 may generate a fourth parity result from a fourth set of message bits using equation (3d). Each of the message processors receives message bits corresponding to a stage of the message it is to process. Each of the message processor also receives either a partial result corresponding to a prior stage of the message or, in the case of the first message processor 520, an initial value.

According to an exemplary embodiment of the present invention, the multi-stage message processor 510 and the accumulator unit 520 generate checksums utilizing CRC-32, where a generator polynomial of $G=x^{32}+x^{26}+x^{23}+x^{22}+x^{16}+x^{12}+x^{11}+x^{10}+x^{8}+x^{7}+x^{6}+x^{5}+x^{4}+x^{2}+x^{1}+x^{0}$ is used. In this exemplary embodiment, the first message processor 520 computes a 32 bit parity result for a first set of 0–7 bits (b[0]–b[7]) of the message utilizing equations listed in FIG. 6a, which are derived from equation (3a). The second message processor 530 computes a 32 bit parity result for a second set of 8–15 bits (b[8]–b[15]) of the message utilizing the equations listed in FIG. 6b, which are derived from equation (3b). The third message processor 540 computes a 32 bit parity result for a third set of 16–23 bits (b[16]–b[23]) of the message utilizing the equations listed in FIG. 6c, which are derived from equation (3c). The fourth message processor 540 computes a 32 bit parity result for a fourth set of 24–31 bits (b[24]–b[31]) of the message utilizing the equations listed in FIG. 6d, which are derived from equation (3d).

Referring back to FIG. 5, it should be appreciated that message processors 520, 530, 540, and 550 may be used to process incomplete messages. Incomplete messages may occur, for example, when message bits in a set are missing due to latency in transmission. If a set of message bits corresponding to a stage in the message are missing, the message processor responsible for processing that set passes the previous message processor's parity results through to the next message processor unchanged. Subsequent message processors in the multi-stage message processor 510 continue to operate as before provided they have message bits to process. The highest order message processor 550 produces the value Sg–b, where b is the number of total bits that were missing. Instead of calculating Sn+g=Sg+Zg(Sn), in the case of missing message bits, the parity result adjuster 560 calculates $Sn+g-b=Sg-b+Zg-b(Sn)$. The calculation of the Z function varies with the number of non-blank message bits are processed by the multi-stage message processor 510.

Figure 7:
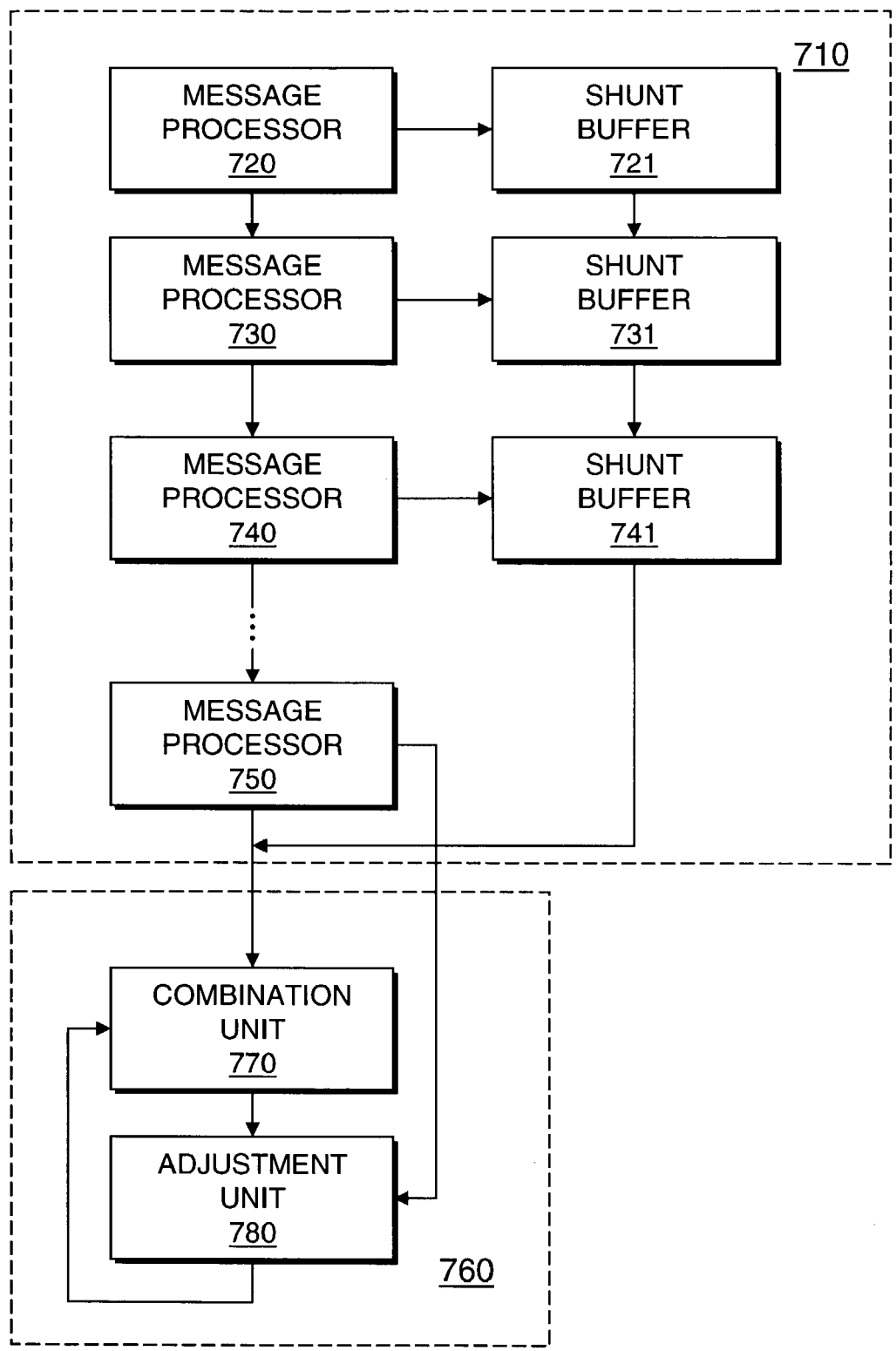
FIG. 7 is a block diagram of the multi-stage message processor and accumulator unit shown in FIG. 2 according to an alternate embodiment of the present invention.

FIG. 7 is a block diagram illustrating a multi-stage message processor 710 and an accumulator unit 760 according to an alternate embodiment of the present invention. The multi-stage message processor 710 and the accumulator unit 760 may be used to implement the multi-stage message processor 420 and the accumulator unit 430 shown in FIG. 4. The multi-stage message processor 710 includes message processors 720, 730, 740, and 750 that operate similarly to the message processors 520, 530, 540, and 550 (shown in FIG. 5). The accumulator unit 760 includes checksum combination unit 770 and parity result adjuster 780 that operate similarly to the checksum combination unit 570 and parity adjuster 580 (shown in FIG. 5). The multi-stage message processor 710 further includes shunt buffers 721, 731, and 741.

When the message processors 720, 730, and 740 include an end of a first message and a start of a next message, the partial result of the last stage of the first message is transmitted into a shunt buffer corresponding to the message processor processing the partial result. The shunt buffer holds the partial result and forwards it directly to the checksum combination unit 770.

The message processor 410, multi-stage message processor 420 (510 and 710 shown in FIGS. 5 and 7), and accumulator unit 430 (560 and 760 shown in FIGS. 5 and 7) may be implemented using any known circuitry or technique. According to an embodiment of the linear block code processor 111, the message processor 410, multi-stage message processor 420 (510 and 710 shown in FIGS. 5 and 7), and accumulator unit 430 (560 and 760 shown in FIGS. 5 and 7) all reside in a single semiconductor substrate. In this embodiment, the message processor 410, multi-stage message processor 420 (510 and 710 shown in FIGS. 5 and 7), and accumulator unit 430 (560 and 760 shown in FIGS. 5 and 7) may be implemented using a programmable logic device or a field programmable logic array.

According to an alternate embodiment of the present invention, the methods described are performed in response to a processor executing sequences of instructions contained in a memory. Such instructions may be read into the memory, for example, from a computer-readable medium. It should be appreciated that, hard-wire circuitry may be used in place of or in combination with software instructions to implement the methods described. Thus, the present invention is not limited to any specific combination of hardware circuitry and software.

Figure 8:
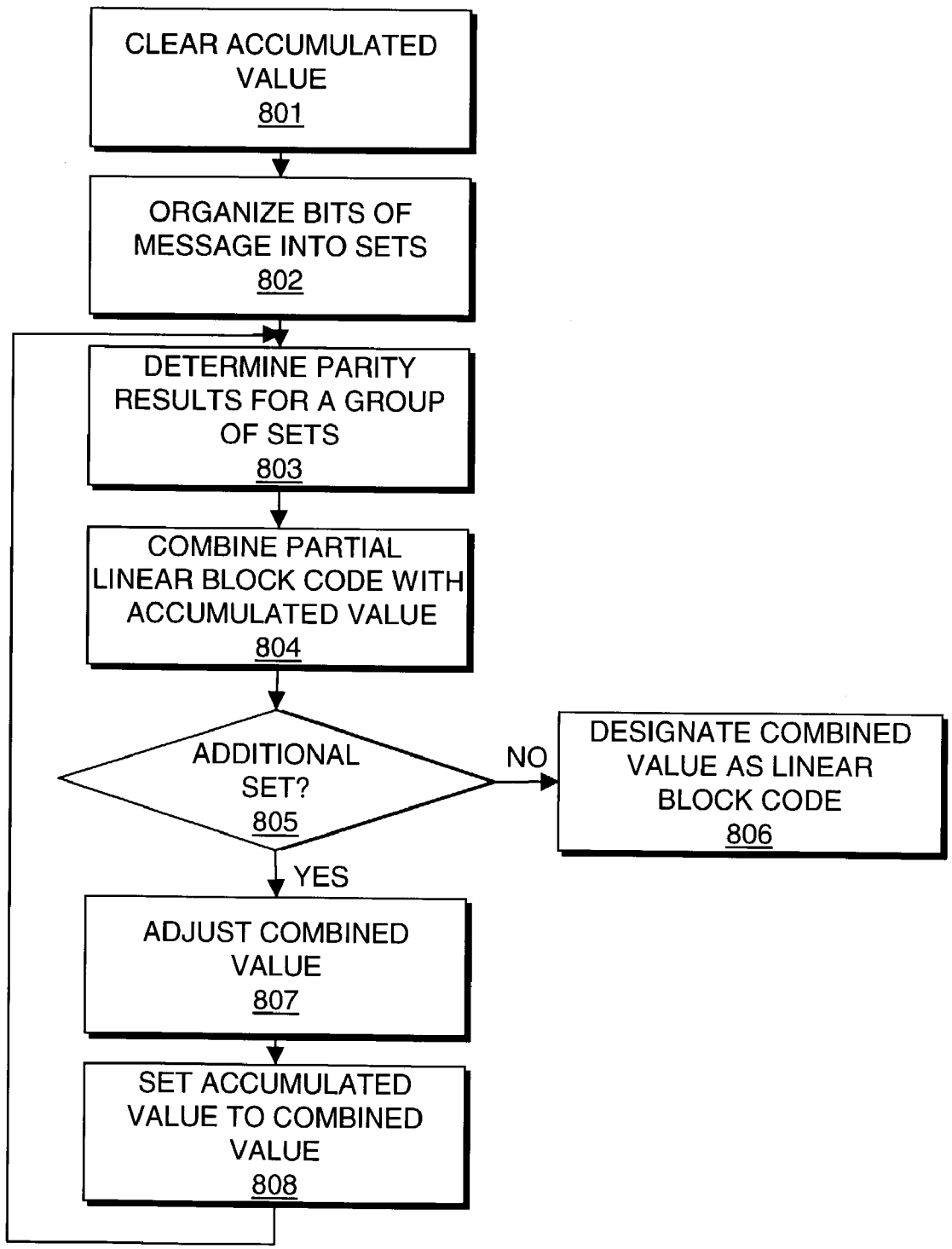
FIG. 8 is a flow chart illustrating a method for performing parallel computation of a linear block code according to an embodiment of the present invention.

FIG. 8 is a flow chart illustrating a method for determining a linear block code according to an embodiment of the present invention. At step 801, an accumulated value is set to zero. According to an embodiment, the accumulated value may be stored in a register that is cleared.

At step 802, message bits are organized into sets. According to an embodiment, a fixed number of consecutive message bits are allocated into each set. The sets may be designated an order from lowest to highest that corresponds with the order of significance of the message bits.

At step 803, parity results are determined for a group of the sets that have not previously been processed. The parity result for each set is determined sequentially from highest to lowest order where the first bits processed correspond to the highest order coefficient terms of the polynomial. The parity result from each set is utilized in determining the parity result of the next higher order set. According to an embodiment, a parity result for a set is determined from message bits from the set and either an initial value or a parity result from a previous, lower order set. The parity result corresponding to the highest order set of the group is designated as the partial linear block code.

It should be appreciated that parity results for a plurality of groups may be processed in parallel in a pipelined fashion. For example, dedicated hardware may be used for processing a first stage through nth stage of a message. After the dedicated hardware for processing a first stage of a message is completed processing the first stage of a first message, it begins processing the first stage of a second message. Processing of the first stage of the second message may be performed concurrently while dedicated hardware for processing a second stage of a message is processing the second stage of the first message. Similarly, after the dedicated hardware for processing the first stage of the message is completed processing the first stage of the second message, it begins processing the first stage of the third message. After the dedicated hardware for processing the second stage of the message is completed processing the second stage of the first message, it begins processing the second stage of the second message. Processing of the first stage of the third message and the second stage of the second message may be performed concurrently while dedicated hardware for processing a third stage of a message is processing the third stage of the first message.

At step 804, the partial linear block code is combined with the accumulated value. According to an embodiment, the combination is achieved by adding the two values together.

At step 805, it is determined whether an additional set needs to be processed. If no additional set needs to be processed, control proceeds to step 806. If an additional set needs to be processed, control proceeds to step 807.

At step 806, the combined value calculated at step 804 is designated as the linear block code for the message.

At step 807, the combined value calculated at step 804 is adjusted. According to an embodiment, the combined value is adjusted by shifting the combined value g bit values to the left, where g is a number of bits in the group processed in step 803. The adjusted value is then divided by a generator polynomial.

At step 808, the accumulated value is set to the adjusted combined value calculated at step 807. Control proceeds to step 803.

Figure 9:
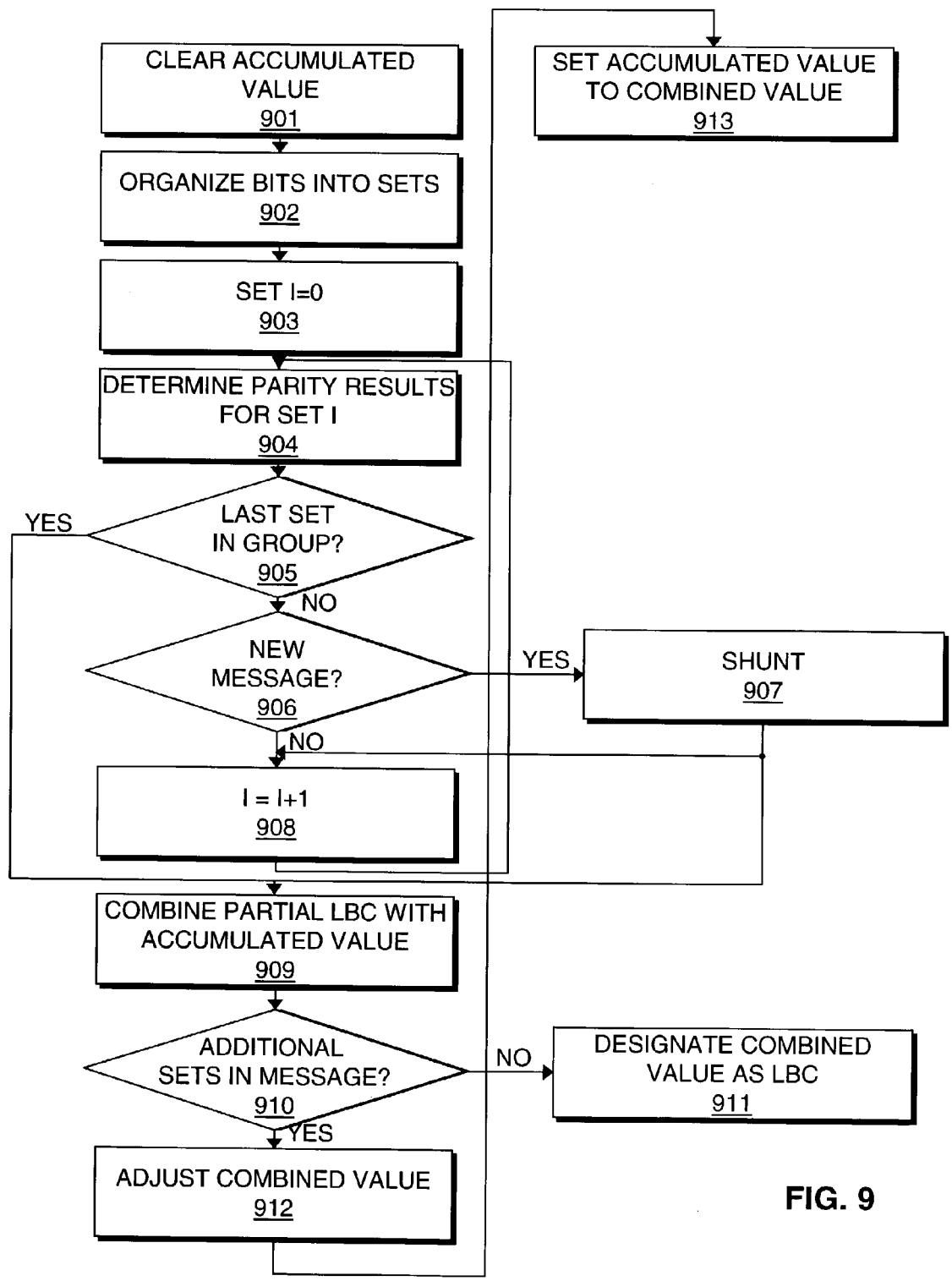
FIG. 9 is a flow chart illustrating a method for performing parallel computation of a linear block code according to an a second embodiment of the present invention.

FIG. 9 is a flow chart illustrating a method for determining a linear block code according to a second embodiment of the present invention. In this embodiment, the multi-stage message processor 710 (shown in FIG. 7) and the accumulator unit 760 (shown in FIG. 7) may be used to implement this method. At step 901, an accumulated value is set to zero. According to an embodiment, the accumulated value may be stored in a register that is cleared.

At step 902, message bits are organized into sets. The message bits may correspond to a single or a plurality of messages. According to an embodiment, a fixed number of consecutive message bits are allocated into each set. The sets may be designated an order from lowest to highest that corresponds with the order of significance of the message bits.

At step 903, the value I is set to 0.

At step 904, parity results are determined for a set I of the group. The parity result for each set is determined sequentially from highest to lowest order where the first bits processed correspond to the highest order coefficient terms of the polynomial. The parity result from each set is utilized in determining the parity result of the next higher order set. According to an embodiment, a parity result for a set is determined from message bits from the set and either an initial value or a parity result from a previous, lower order set. The parity result corresponding to the highest order set of the group or the last set corresponding to a message is designated as the partial linear block code.

It should be appreciated that parity results for a plurality of groups may be processed in parallel in a pipelined fashion. For example, dedicated hardware may be used for processing a first stage through nth stage of a message. After the dedicated hardware for processing a first stage of a message is completed processing the first stage of a first message, it begins processing the first stage of a second message. Processing of the first stage of the second message may be performed concurrently while dedicated hardware for processing a second stage of a message is processing the second stage of the first message. Similarly, after the dedicated hardware for processing the first stage of the message is completed processing the first stage of the second message, it begins processing the first stage of the third message. After the dedicated hardware for processing the second stage of the message is completed processing the second stage of the first message, it begins processing the second stage of the second message. Processing of the first stage of the third message and the second stage of the second message may be performed concurrently while dedicated hardware for processing a third stage of a message is processing the third stage of the first message.

At step 905, it is determined whether set I is the last set in the group. If set I is not the last set in the group, control proceeds to step 906. If set I is the last set in the group, control proceeds to step 909.

At step 906, it is determined whether set I+1 includes bits from a new message. The new message may be a message different than the message corresponding to set I. If set I+1 includes bits from a new message, control proceeds to step 907. If set I+1 does not include bits from a new message, control proceeds to step 908.

At step 907, the parity results determined for set I is shunted. According to an embodiment of the present invention, the parity results for set I is stored in a shunt buffer where no further processing is performed until the parity results are transmitted to the accumulator unit 760 where step 909 is performed. According to an embodiment, the multi-stage message processor 710 proceeds in processing the sets of message bits in the new message as control proceeds to step 908 concurrently with step 909.

At step 908, the value I+1 is assigned to I.

At step 909, the partial linear block code is combined with the accumulated value. According to an embodiment, the combination is achieved by adding the two values together.

At step 910, it is determined whether an additional set needs to be processed. If no additional set needs to be processed, control proceeds to step 911. If an additional set needs to be processed, control proceeds to step 917.

At step 911, the combined value calculated at step 909 is designated as the linear block code for the message.

At step 912, the combined value calculated at step 909 is adjusted. According to an embodiment, the combined value is adjusted by shifting the combined value g bit values to the left, where g is a number of bits in the group processed in step 904. The adjusted value is then divided by a generator polynomial.

At step 913, the accumulated value is set to the adjusted combined value calculated at step 912. Control proceeds to step 903.

FIGS. 8 and 9 illustrate flow charts describing a method for determining a linear block code. Some of the steps illustrated in this figure may be performed sequentially, in parallel or in an order other than that which is described. It should be appreciated that not all of the steps described are required to be performed, that additional steps may be added, and that some of the illustrated steps may be substituted with other steps.

FIG. 10 is a table illustrating processing of linear block codes where the input bits are associated with full groups. FIG. 11 is a table illustrating processing of linear block codes where the input bits are associated with full and partial groups. FIG. 12 is a table illustrating processing of linear block codes where the input bits are associates with a plurality of groups. In FIGS. 11 and 12, the italicized numbers represent processing performed on partial groups. The bolded numbers represent processing performed on bits of a second message.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for computing a single linear block code for a message, comprising:
having a linear block code processor organize bits of the message into sets corresponding to stages of the message;
having the linear block code processor determine a parity result for each of the sets from bits of the message in a set; and
having the linear block code processor determine the single linear block code from the parity results such that the single linear block code is a function of all of the bits of the message.

2. The method of claim 1, wherein determining the parity result comprises designating a parity result corresponding to a last stage of the message as the linear block code for the message.

3. The method of claim 1, wherein determining the parity result comprises:
designating a parity result corresponding to an end stage as a partial linear block code;
adjusting the partial linear block code; and
combining a parity result corresponding to a last stage of the message with the partial linear block code.

4. The method of claim 3, wherein the parity result corresponding to the end stage is generated by a last stage of a multi stage message processor.

5. The method of claim 3, wherein adjusting the partial linear block code comprises:
shifting the partial linear block code g bits to the left, where g is a number of message bits associated with generating the partial linear block code; and
dividing the partial linear block code by a generator polynomial.

6. The method of claim 1, wherein organizing the bits of the message into sets comprises allocating a fixed number of consecutive bits of the message into the sets.

7. The method of claim 6, wherein the fixed number is 4.

8. The method of claim 6, wherein the fixed number is 8.

9. The method of claim 6, wherein the fixed number is 16.

10. The method of claim 1, further comprising:
organizing bits of a second message into second sets each representing a stage of the second message;

determining a parity result for each of the second sets from bits of the second message in a second set and either the initial value or a parity result of a second set from a previous stage of the second message; and determining a linear block code for the second message from the parity results for each of the second sets.

11. The method of claim 10, wherein a parity result for one of the sets is determined in parallel with a parity result for one of the second sets.

12. The method of claim 10, wherein a parity result for a second set corresponding to a first stage of the second message is determined in parallel with a parity result for a set corresponding to a second stage of the message.

13. A method for computing linear block codes for a first and second message, comprising:

having a linear block code processor organize bits of the first message into first sets corresponding to stages of the first message;

having the linear block code processor organize bits of the second message into second sets corresponding to stages of the second message;

having the linear block code processor determine parity results for each of the first and second sets based upon bits in a set, wherein the determination of the parity results for each of the first and second sets is pipelined; and having the linear block code processor determine linear block codes of the first and second messages from the parity results.

14. The method of claim 13, wherein determining linear block codes of the first and second messages from the parity results comprises designating parity results corresponding to last stages of the messages as the linear block codes for the messages.

15. The method of claim 13, wherein determining linear block codes of the first and second messages from the parity results comprises:

designating parity results corresponding to a boundary stage as partial linear block codes;

adjusting the partial linear block codes;

combining parity results corresponding to last stages of the messages with the partial linear block codes.

16. The method of claim 13, wherein organizing the bits of the first message into sets comprises allocating a fixed number of consecutive bits of the first message into the sets.

17. A method for computing linear block codes for messages, comprising:

having a linear block code processor organize bits of messages into sets corresponding to stages of the messages;

having the linear block code processor determine parity results for each of the sets from bits in a set, wherein the determination of the parity results for the sets is pipelined; and having the linear block code processor determine linear block codes for the messages from the parity results.

18. The method of claim 17, wherein determining linear block codes of the messages from the parity results comprises designating parity results corresponding to last stages of the messages as the linear block codes for the messages.

19. The method of claim 17, wherein determining linear block codes of the messages from the parity results comprises:

designating parity results corresponding to a boundary stages as partial linear block codes;

adjusting the partial linear block codes; and combining parity results corresponding to last stages of the messages with the partial linear block codes.

20. The method of claim 17, wherein determining parity results comprises pipelining sets from 4 messages.

21. The method of claim 17, wherein determining parity results comprises pipelining sets from 6 messages.

22. The method of claim 17, wherein determining parity results comprises pipelining sets from 8 messages.

23. A method for computing a linear block code for a message, comprising:

having a linear block code processor organize bits of the message into sets corresponding to stages of the message;

having the linear block code processor determine a parity result for each of the sets, wherein each parity result for a set is computed only from bits from the set; and having the linear block code processor determine the linear block code from the parity results.

24. The method of claim 23, wherein determining the parity result comprises designating a parity result corresponding to a last stage of the message as the linear block code for the message.

25. The method of claim 23, wherein determining the parity result comprises:

designating a parity result corresponding to an end stage as a partial linear block code;

adjusting the partial linear block code; and combining a parity result corresponding to a last stage of the message with the partial linear block code.

26. The method of claim 25, wherein the parity result corresponding to the end stage is generated by a last stage of a multi-stage message processor.

27. The method of claim 25, wherein adjusting the partial linear block code comprises:

shifting the partial linear block code g bits to the left, where g is a number of message bits associated with generating the partial linear block code; and dividing the partial linear block code by a generator polynomial.

28. The method of claim 23, wherein organizing the bits of the message into sets comprises allocating a fixed number of consecutive bits of the message into the sets.

29. The method of claim 23, further comprising:

organizing bits of a second message into second sets each representing a stage of the second message;

determining a parity result for each of the second sets from bits of the second message in a second set and either the initial value or a parity result of a second set from a previous stage of the second message; and determining a linear block code for the second message from the parity results for each of the second sets.

30. The method of claim 29, wherein a parity result for one of the sets is determined in parallel with a parity result for one of the second sets.

31. The method of claim 29, wherein a parity result for a second set corresponding to a first stage of the second message is determined in parallel with a parity result for a set corresponding to a second stage of the message.

* * * * *